(12) United States Patent
Loughmiller

(10) Patent No.: US 6,377,089 B1
(45) Date of Patent: *Apr. 23, 2002

(54) OUTPUT DRIVER

(75) Inventor: Daniel R. Loughmiller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/621,494

(22) Filed: Jul. 21, 2000

Related U.S. Application Data

(63) Continuation of application No. 08/771,552, filed on Dec. 11, 1996, now Pat. No. 6,097,223.

(51) Int. Cl.[7] .................... H03K 3/00; H03K 17/16
(52) U.S. Cl. ................ 327/112; 327/384; 327/389; 326/27; 326/87
(58) Field of Search .................... 326/21–27, 82, 326/83, 87, 112, 108; 327/379, 383, 384, 389

(56) References Cited

U.S. PATENT DOCUMENTS

| | | | |
|---|---|---|---|
| 4,791,321 A | * 12/1988 | Tanaka et al. ............. 326/27 |
| 5,001,369 A | 3/1991 | Lee ....................... 307/473 |
| 5,097,149 A | 3/1992 | Lee ....................... 307/443 |
| 5,157,279 A | * 10/1992 | Lee ........................ 326/83 |
| 5,367,205 A | 11/1994 | Powell ................... 326/27 |
| 5,369,317 A | 11/1994 | Casper et al. ............ 326/87 |
| 5,371,420 A | 12/1994 | Nakao .................... 326/27 |
| 5,382,847 A | 1/1995 | Yasuda ................... 326/68 |
| 5,811,857 A | * 9/1998 | Assaderaghi et al. .... 257/355 |
| 5,929,473 A | * 7/1999 | Sakuragi ................ 327/112 |
| 6,097,223 A | * 8/2000 | Loughmiller ........... 327/112 |
| 6,172,516 B1 | * 1/2001 | Han et al. ............... 326/27 |

FOREIGN PATENT DOCUMENTS

JP 4-321321 11/1992 ............. 326/27

* cited by examiner

Primary Examiner—Toan Tran
Assistant Examiner—Long Nguyen
(74) Attorney, Agent, or Firm—Schwegman, Lundberg, Woessner & Kluth, P.A.

(57) ABSTRACT

An integrated circuit output driver provides high speed communication, such as between integrated circuits in spite of appreciable interconnection capacitance. The output driver reduces the current sourced or sunk from a circuit node during its switching as its voltage approaches power supply or ground voltages. This reduces the voltage swing and ringing at the circuit node during high speed communication, thus reducing switching time. The output driver provides full voltage swing under quiescent conditions, preserving minimum leakage currents in steady state.

32 Claims, 7 Drawing Sheets

OUTPUT DRIVER

This application is a continuation of U.S. Ser. No. 08/771,552, filed Dec. 11, 1996 now U.S. Pat. No. 6,097,223.

FIELD OF THE INVENTION

This invention relates to integrated circuits, and more particularly to an output driver for providing an output voltage.

BACKGROUND

Integrated circuit chips often utilize special output driver circuit topologies for high speed communication of binary logic voltages to other integrated circuit chips in spite of appreciable interconnection capacitance.

FIG. 1 is a schematic/block diagram illustration of a typical output driver. An output driver 100 on a first integrated circuit chip 110 is connected at circuit node 120 to an input buffer 130 on a second integrated circuit chip 140. Output driver 100 comprises a pullup device, such as n-channel metal-oxide-semiconductor (NMOS) pullup field-effect transistor (FET) 150, and a pulldown device, such as NMOS pulldown FET 160. Pullup FET 150 has a drain terminal coupled to a first voltage, such as a positive power supply voltage, at node 170, a gate terminal receiving a first input signal at node 180, and a source terminal coupled to circuit node 120. Pulldown FET 160 has a source terminal coupled to a second voltage, such as a negative power supply or ground voltage, at node 190, a drain terminal coupled to circuit node 120, and a gate terminal receiving a second input signal at node 200.

In FIG. 1, circuit node 120 is switched from a binary low logic voltage (low) to a binary high logic voltage (high) by holding second input signal 200 low while transitioning first input signal 180 from low to an elevated binary high logic voltage (elevated high), which is more positive than the power supply voltage at node 170. Pullup FET 150 turns on, sourcing current to circuit node 120 to raise its voltage to approximately the power supply voltage at node 170. Circuit node 120 is returned low by transitioning the first input signal at node 180 from elevated high to low and transitioning the second input signal at node 200 from low to elevated high. Pullup FET 150 turns off, and pulldown FET 160 turns on, sinking current from circuit node 120 to lower its voltage to approximately the ground voltage at node 190.

The rate at which circuit node 120 can be switched between low and high is increased by using NMOS pullup and pulldown FETs 150 and 160 respectively, rather than p-channel metal-oxide-semiconductor (PMOS) FETs, which typically have a lower process transconductance. The switching rate of circuit node 120 is also increased by using the elevated high potential, which is more positive than the power supply voltage at node 170, to turn on pullup and pulldown FETs 150 and 160 respectively. The elevated high potential increases the current sourcing and sinking capability of pullup and pulldown FETs 150 and 160, respectively, and also ensures that the output voltage at node 120 is fully raised to approximately that of the power supply voltage at node 170 in a steady state.

FIG. 2 illustrates generally a switching of the voltage 301 at circuit node 120 by the output driver of FIG. 1. Voltage and time are respectively indicated by y-axis 300 and x-axis 310. Voltage level 320 corresponds to power supply node 170 and the voltage level 330 corresponds to ground node 190. Requirements of a minimum output high voltage, $V_{OH}$ 340, and maximum output low voltage, $V_{OL}$ 350, are determined by the input requirements of input buffer 130 and desired noise margins.

FIG. 2 illustrates certain limitations of the output driver of FIG. 1 for high speed switching of circuit node 120. First, a transition switching voltage 301 at circuit node 120 between the voltage level 330 at ground node 190 and the voltage level 320 at power supply node 170 typically exceeds the minimum voltage transition 360 required for proper interpretation of low and high binary logic voltages. This extra voltage excursion increases switching time and power consumption. Second, such a transition in voltage 301 of circuit node 120 is sometimes accompanied by ringing, which may require additional settling time before low and high binary logic voltages can be properly interpreted.

SUMMARY

This invention includes a method and apparatus for an output driver with improved switching speed capability and reduced ringing.

The method is directed to switching a voltage at a circuit node between first and second voltages. A first pullup current is provided to the circuit node, in response to a first input signal. This increases the voltage at the circuit node to approximately within a first translated voltage from the first voltage. A second pullup current is then provided to the circuit node, after the voltage at the circuit node is increased to approximately within the first translated voltage from the first voltage. This further increases the voltage at the circuit node toward the first voltage in a first steady state. The method also includes providing a first pulldown current to the circuit node, in response to a second input signal. This decreases the voltage at the circuit node to approximately within a second translated voltage from the second voltage. A second pulldown current is then provided to the circuit node, after the voltage at the circuit node is decreased to approximately within the second translated voltage from the second voltage. This further decreases the voltage at the circuit node toward the second voltage in a second steady state.

The apparatus is directed to an output driver, in which a first pullup device is coupled to and receives a first voltage. The first pullup device couples an output node to the received first voltage. A first pulldown device is coupled to and receives a second voltage, and couples the output node to the received second voltage. A second pullup device is coupled to and receives a third voltage, which is between the first and second voltages in magnitude. The second pullup device couples the output node to the received third voltage. A second pulldown device is coupled to and receives a fourth voltage, which is between the second and third voltages in magnitude. The second pulldown device couples the output node to the received fourth voltage.

In one embodiment, the output driver further comprises first and second voltage translators. The first voltage translator is coupled to and receives the first voltage. The first voltage translator is also coupled to and provides the third voltage to the second pullup device. The second voltage translator is coupled to and receives the second voltage. The second voltage translator is also coupled to and provides the fourth voltage to the second pulldown device.

In one embodiment, the first and second voltage translators each comprise diode-connected n-channel metal-oxide-semiconductor (NMOS) field-effect transistors (FETs).

In another embodiment, the first and second voltage translators comprise diode-connected p-channel metal-oxide-semiconductor (PMOS) FETs.

In yet another embodiment, the first and second voltage translators comprise pn junction diodes.

The invention reduces the current sourced or sunk from a circuit node during its switching as its voltage approaches the first or second voltages. Thus, the invention provides a method and apparatus for an output driver with improved switching speed capability and reduced ringing.

BRIEF DESCRIPTION OF THE DRAWINGS

In the drawings, like numerals describe like components throughout the several views.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents.

Figure 3:
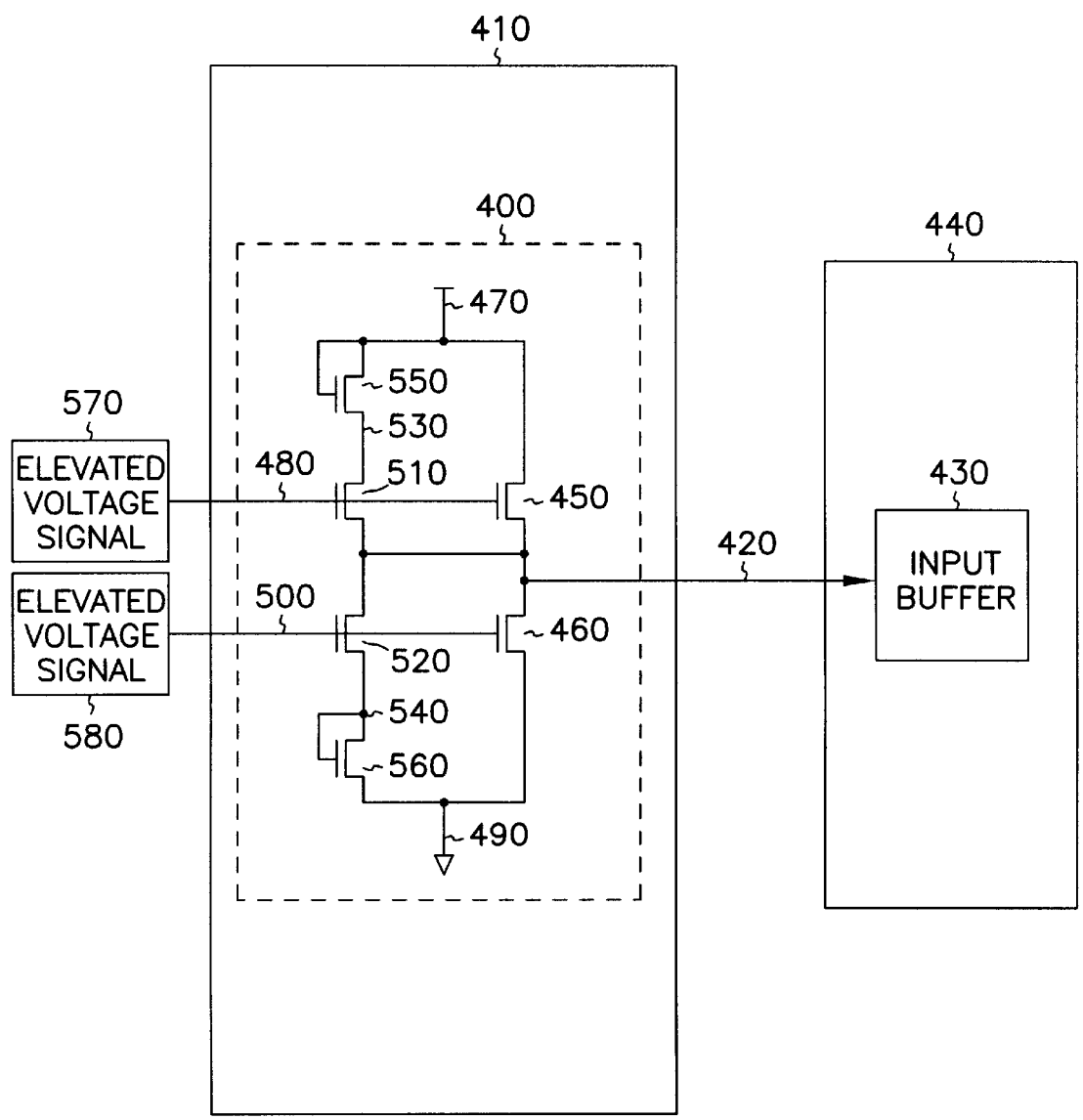
FIG. 3 is a schematic/block diagram of one embodiment of an output driver according to the invention communicating between integrated circuits.

This invention provides an output driver with improved switching speed capability and reduced ringing. FIG. 3 is a schematic/block diagram of one embodiment of the output driver of the present invention. In FIG. 3, the output driver 400 on a first integrated circuit chip 410 is coupled at circuit node 420 to an input buffer 430 on a second integrated circuit chip 440. Output driver 400 comprises a pullup device, such as n-channel metal-oxide-semiconductor (NMOS) pullup field-effect transistor (PET) 450, and a pulldown device, such as NMOS pulldown FET 460. Pullup FET 450 has a drain terminal coupled to a first voltage, such as a positive power supply voltage, at node 470, a gate terminal receiving a first input signal at node 480, and a source terminal coupled to circuit node 420. Pulldown FET 460 has a source terminal coupled to a second voltage, such as a negative power supply or ground voltage, at node 490, a drain terminal coupled to circuit node 420, and a gate terminal receiving a second input signal at node 500.

In FIG. 3, output driver 400 further comprises a second pullup device, such as NMOS second pullup FET 510, and a second pulldown device, such as NMOS second pulldown FET 520. Second pullup FET 510 has a source terminal coupled to circuit node 420, a gate terminal coupled to the first input signal at node 480, and a drain terminal coupled to and receiving a third voltage at node 530. Second pulldown FET 520 has a drain terminal coupled to circuit node 420, a gate terminal coupled to the second input signal at node 500, and a source terminal coupled to and receiving a fourth voltage at node 540.

In FIG. 3, output driver 400 also includes a first and second voltage translators, such as NMOS first and second translator FETs 550 and 560 respectively. First translator FET 550 has diode-connected drain and gate terminals each coupled to and receiving the first voltage at node 470, and a source terminal coupled to and providing the third voltage at node 530 to second pullup FET 510. Second translator FET 560 has a source terminal coupled to and receiving the second voltage at node 490, and has diode-connected drain and gate terminals each coupled to and providing the fourth voltage at node 540 to second pulldown FET 520. In FIG. 3, the third voltage at node 530 is less positive than the first voltage at node 470 by approximately the threshold voltage of first translator FET 550. Similarly, the fourth voltage at node 540 is more positive than the second voltage at node 490 by approximately the threshold voltage of second translator FET 560. However, the fourth voltage at node 540 is more negative than the third voltage at node 530.

In FIG. 3, circuit node 420 is switched from a binary low logic voltage (low) to a binary high logic voltage (high) by holding second input signal 500 low while transitioning first input signal 480 from low to an elevated binary high logic voltage (elevated high), which is more positive than the power supply voltage at node 470.

Figure 4:
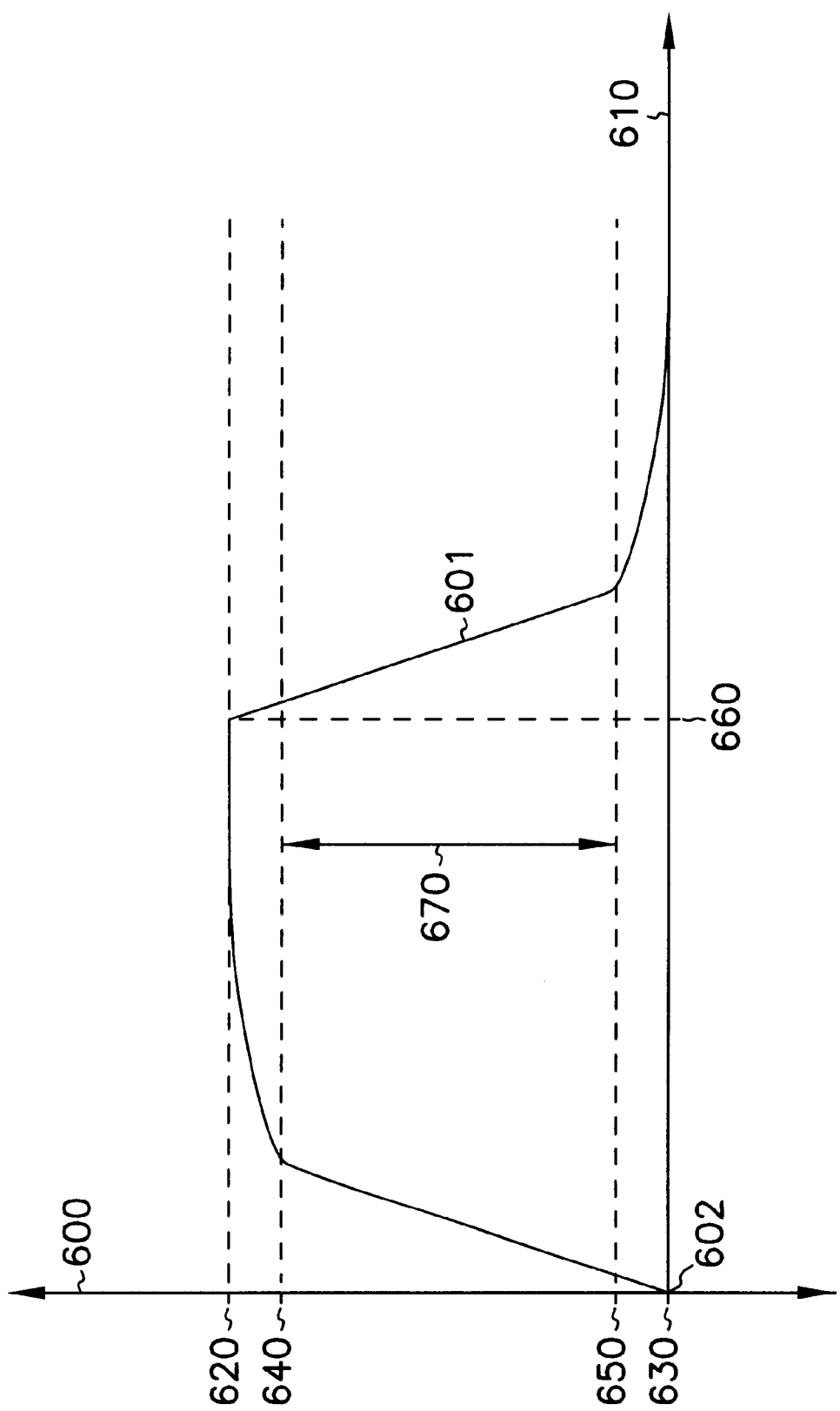
FIG. 4 is a graph illustrating generally voltage vs. time at an output circuit node of the output driver of FIG. 3.

FIG. 4 illustrates generally a resulting switching at time 602 of the voltage 601 at circuit node 420 by the output driver 400 of FIG. 3. Voltage and time are respectively indicated by y-axis 600 and x-axis 610. Voltage level 620 corresponds to power supply node 470 and the voltage level 630 corresponds to ground node 490. The third voltage 640 at node 530 is greater than or equal to the minimum output high voltage $V_{OH}$ 640 needed to meet input voltage and noise margin requirements of input buffer 430. The fourth voltage 650 at node 540 is less than or equal to the maximum output low voltage $V_{OL}$ 650 needed to meet input voltage and noise margin requirements of input buffer 430.

In FIG. 4, first and second pullup FETs 450 and 510 turn on, each sourcing current at their source terminals to raise the voltage 601 at circuit node 420 toward voltage level 620 at power supply node 470. When the voltage 601 at circuit node 420 is approximately equal to third voltage 640 at node 530, second pullup FET 510 turns off. This reduces the current sourced to circuit node 420 accordingly, such that the voltage 601 at circuit node 420 is raised more slowly toward the voltage level 620 at power supply node 470 to reach a first steady state.

In FIG. 4, the voltage 601 at circuit node 420 is returned low at time 660 by transitioning the first input signal at node 480 from elevated high to low and transitioning the second input signal at node 500 from low to elevated high. First and second pullup FETs 450 and 510 turn off, and first and second pulldown FETs 460 and 520 turn on, sinking current at their drain terminals to lower the voltage 601 at circuit node 420 toward voltage level 630 at ground node 490. When the voltage 601 at circuit node 420 is approximately equal to fourth voltage 650 at node 540, second pulldown FET 520 turns off. This reduces the current sunk from circuit node 420 accordingly, such that the voltage 601 at circuit node 420 is lowered more slowly toward voltage 630 at ground node 490 to reach a second steady state.

Figure 1:
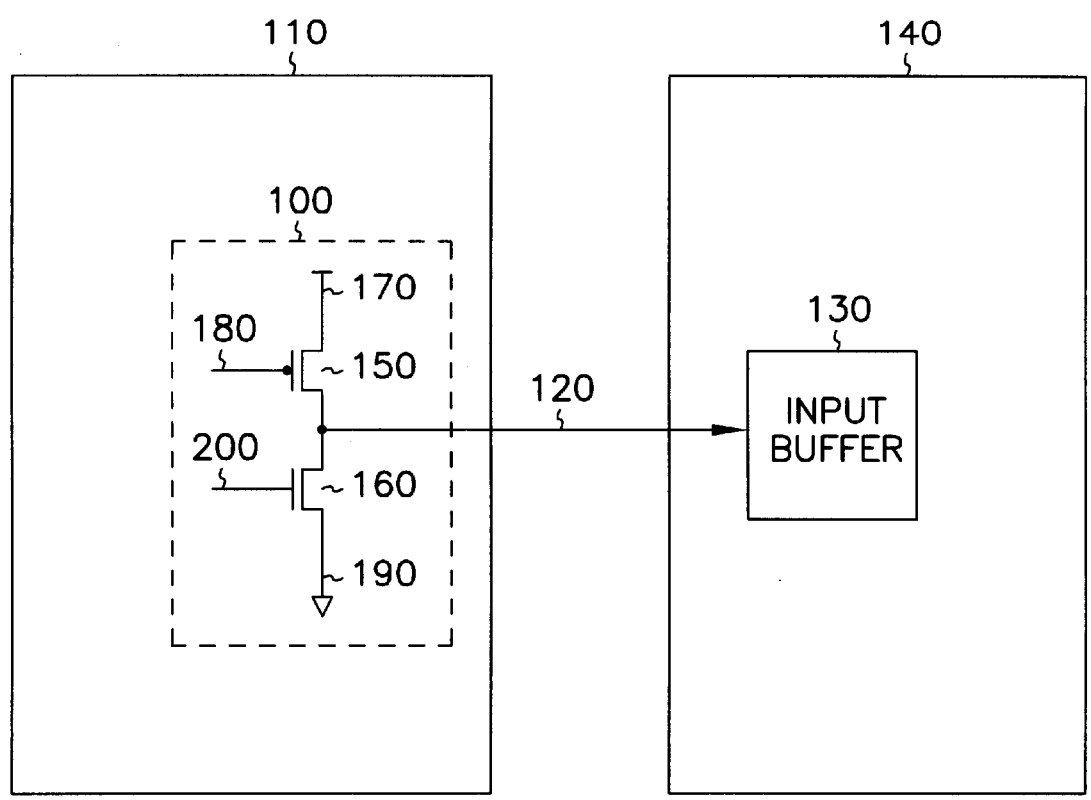
FIG. 1 is a schematic/block diagram of a typical output driver communicating between integrated circuits.
Figure 2:
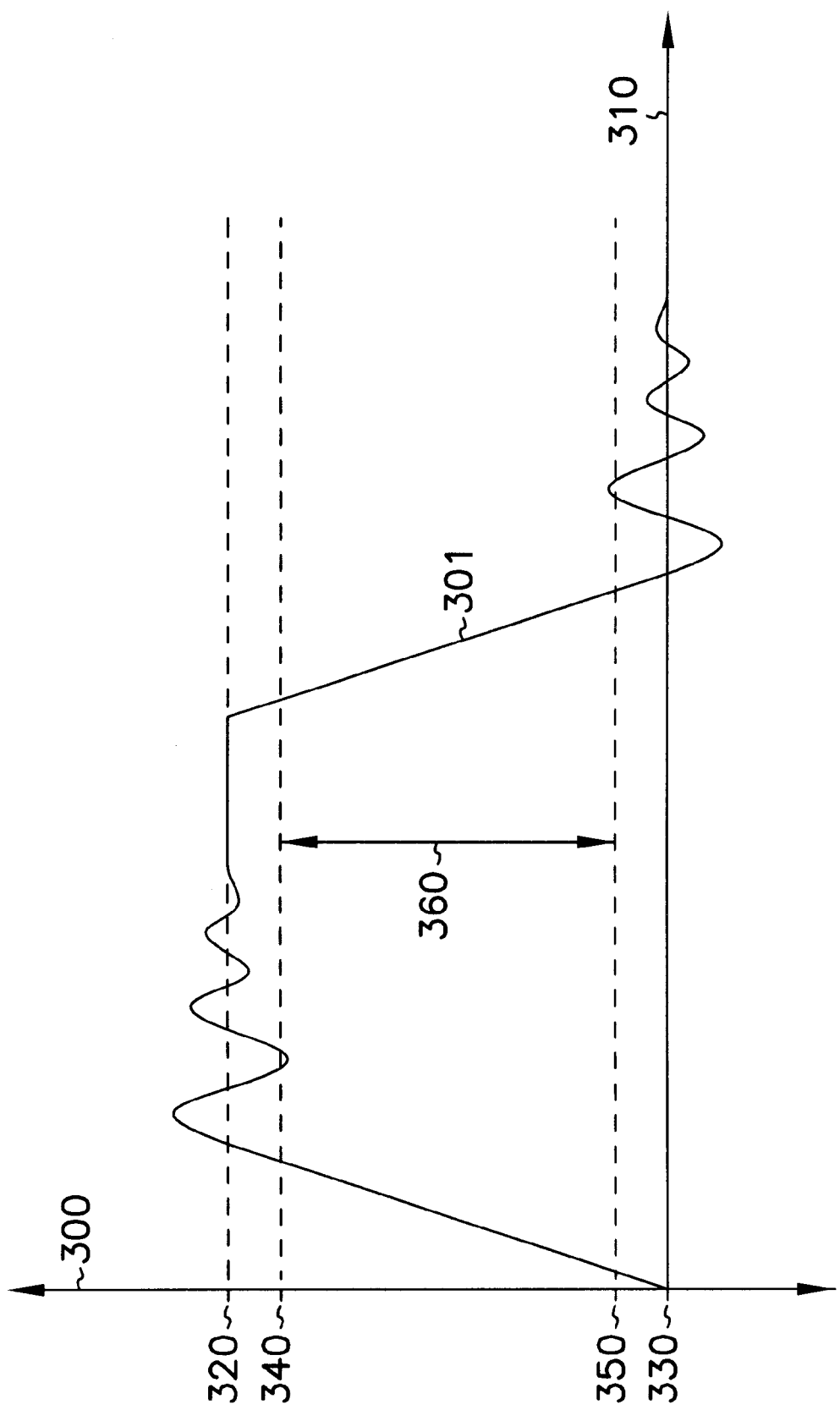
FIG. 2 is a graph illustrating generally voltage vs. time at an output circuit node of the output driver of FIG. 1.

In FIG. 4, when voltage 601 is outside a voltage range 670, which is bounded by third voltage 640 and fourth voltage 650, reduced current is sourced or sunk from circuit node 420. This provides reduced ringing of voltage 601 as compared to voltage 301 of FIG. 2. Outside voltage range 670, the reduced rate of change of voltage 601 toward quiescent first and second steady states reduces excess excursions of voltage 601 during high frequency switching. This reduces the time required to switch voltage 601 at node 420 between high and low logic levels. However, the first and second steady states preserve quiescent high and low logic levels approximately equal to voltage 620 at power supply node 470 and voltage 630 at ground node 490, respectively. This minimizes leakage currents during operation in first and second steady states, or while switching between first and second steady states at a low frequency.

Figure 5:
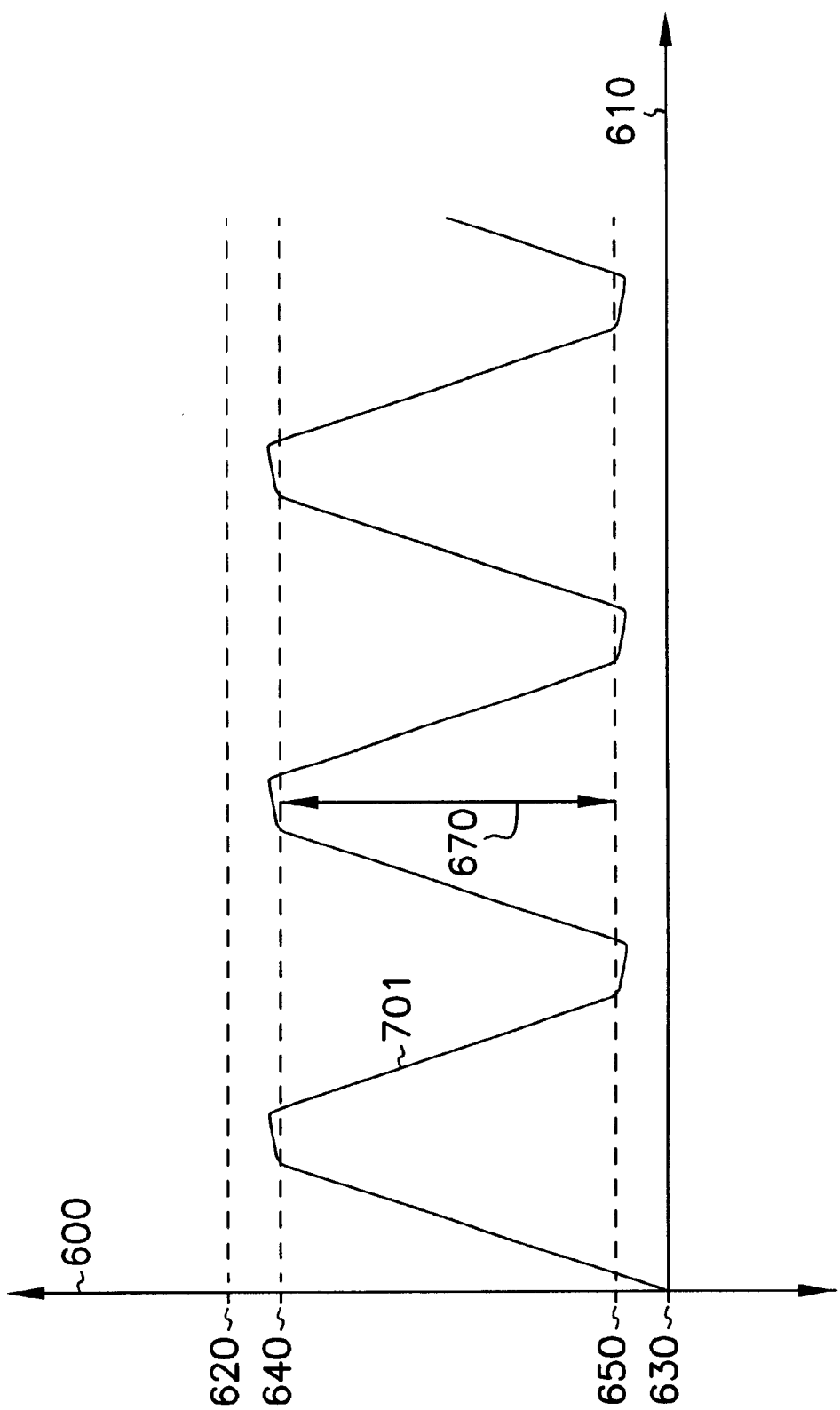
FIG. 5 is a graph illustrating generally voltage vs. time at the output circuit node of the output driver of FIG. 3 at a high switching rate.

FIG. 5 illustrates in more detail a high speed switching of voltage 701 at circuit node 420 using the output driver 400 of FIG. 3. Since the rate of change of voltage 701 outside voltage range 670 is reduced, as described above, the voltage excursion outside voltage range 670 is also reduced. As a result, switching time of voltage 701 is correspondingly reduced.

Figure 6:
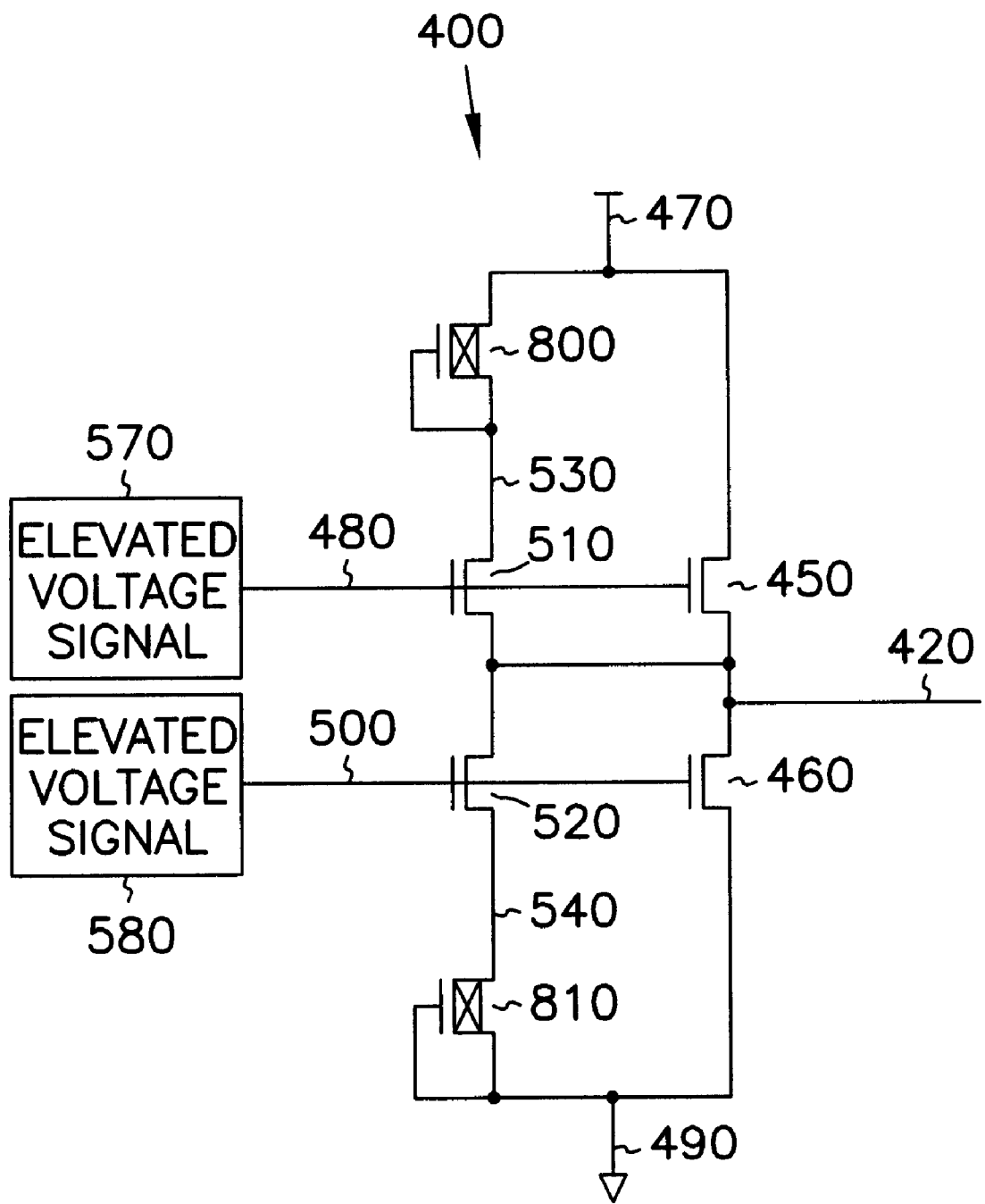
FIG. 6 is a schematic diagram of a first alternative embodiment of the output driver according to the invention.

FIG. 6 illustrates an alternative embodiment of output driver 400, in which first and second voltage translators comprise p-channel metal-oxide-semiconductor (PMOS) first and second translator FETs 800 and 810, respectively. First translator FET 800 has a source terminal coupled to and receiving the first voltage at node 470, and diode-connected drain and gate terminals each coupled to and providing the third voltage at node 530 to second pullup FET 510. Second translator FET 810 has diode-connected drain and gate terminals coupled to and receiving the second voltage at node 490, and has a source terminal coupled to and providing the fourth voltage at node 540 to second pulldown FET 520. In FIG. 6, the third voltage at node 530 is less positive than the first voltage at node 470 by approximately the threshold voltage of first translator FET 800. Similarly, the fourth voltage at node 540 is more positive than the second voltage at node 490 by approximately the threshold voltage of second translator FET 810. However, the fourth voltage at node 540 is more negative than the third voltage at node 530.

Figure 7:
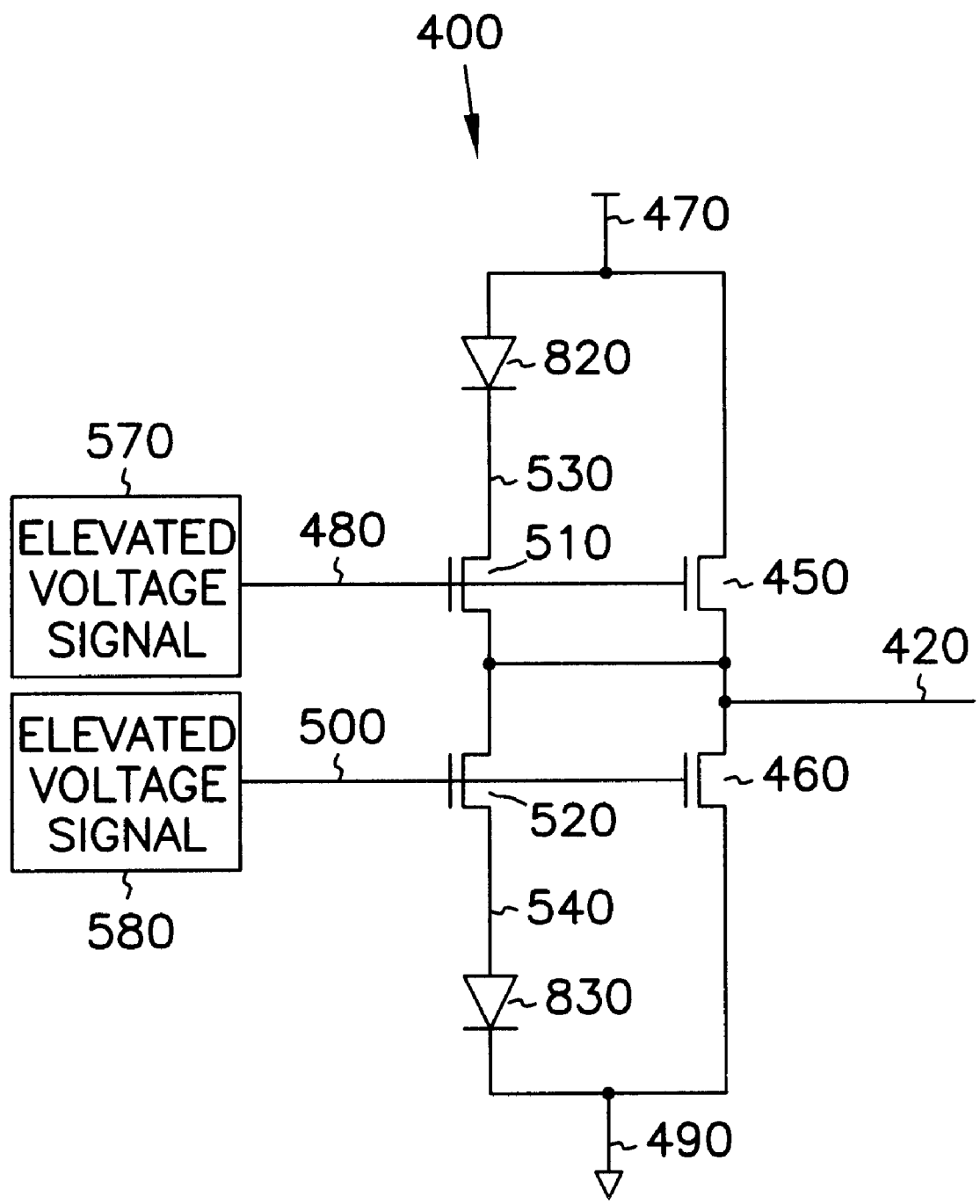
FIG. 7 is a schematic diagram of a second alternative embodiment of the output driver according to the invention.

FIG. 7 illustrates an alternative embodiment, in which first and second voltage translators comprise first and second pn junction translator diodes 820 and 830, respectively. First translator diode 820 has an anode terminal coupled to and receiving the first voltage at node 470, and a cathode terminal coupled to and providing the third voltage at node 530 to second pullup FET 510. Second translator diode 830 has a cathode terminal coupled to and receiving the second voltage at node 490, and has an anode terminal coupled to and providing the fourth voltage at node 540 to second pulldown FET 520. In FIG. 7, the third voltage at node 530 is less positive than the first voltage at node 470 by approximately the turn-on voltage of first translator diode 820. Similarly, the fourth voltage at node 540 is more positive than the second voltage at node 490 by approximately the turn-on voltage of second translator diode 830. However, the fourth voltage at node 540 is more negative than the third voltage at node 530.

Thus, the invention provides an output driver with improved switching speed capability and reduced ringing. The output driver according to the present invention is particularly useful for high speed communication of binary logic voltages to other integrated circuit chips in spite of appreciable interconnection capacitance.

It should also be noted that in complementary metal-oxide-semiconductor (CMOS) technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An output driver reducing overshoots of voltage at a first power supply voltage and undershoots of voltage at a second power supply voltage, comprising:

a first circuit for converting a first input signal to a first voltage that exceeds the first power supply voltage;

a second circuit for converting a second input signal to a second voltage that exceeds the first power supply voltage, the second input signal being complementary to the first input signal;

a first n-channel pull up field-effect transistor (FET), having a drain terminal coupled to the first power supply voltage, a source terminal coupled to an output node, and a gate terminal coupled to the first voltage, wherein the first n-channel pull up FET couples the first power supply voltage to the output node when the first n-channel pull up FET is on;

a first n-channel pulldown FET, having a source terminal coupled to the second power supply voltage, a drain terminal coupled to the output node, and a gate terminal coupled to the second voltage, wherein the first n-channel pulldown FET couples the second power supply voltage to the output node when the first n-channel pulldown FET is on;

a second n-channel pull up FET, having a drain terminal coupled to a third voltage between the first and second power supply voltages in magnitude, a source terminal coupled to the output node, and a gate terminal coupled to the first voltage, the second n-channel pull up FET being turned off when a voltage at the output node monotonously increases from the third voltage to first power supply voltage;

a second n-channel pulldown FET, having a source terminal coupled to a fourth voltage between the second power supply voltage and the third voltage in magnitude, a drain terminal coupled to the output node, and a gate terminal coupled to the second voltage, the second n-channel pulldown FET being turned off when a voltage at the output node monotonously decreases from the fourth voltage to the second power supply voltage; and whereby a voltage swing at the output node includes a fall range of voltages between the first and second power supply voltages.

2. The output driver of claim 1, further comprising:

a first n-channel voltage translator FET, having drain and gate terminals each coupled to and receiving the first power supply voltage, and having a source terminal coupled to and providing the third voltage to the second n-channel pullup FET; and a second n-channel voltage translator FET, having a source terminal coupled to and receiving the second power supply voltage, and having drain and gate terminals each coupled to and providing the fourth voltage to the second n-channel pulldown FET.

3. The output driver of claim 1, further comprising:
a first p-channel voltage translator FET, having a source terminal coupled to and receiving the first power supply voltage, and having drain and gate terminals each coupled to and providing the third voltage to the second n-channel pull up FET; and
a second p-channel voltage translator FET, having drain and gate terminals each coupled to and receiving the second power supply voltage, and having a source terminal coupled to and providing the fourth voltage to the second n-channel pulldown FET.

4. The output driver of claim 1, further comprising:
a first translator diode, having an anode terminal coupled to and receiving the first power supply voltage, and having a cathode terminal coupled to and providing the third voltage to the second n-channel pullup FET; and
a second translator diode, having a cathode terminal coupled to and receiving the second power supply voltage, and having an anode terminal coupled to and providing the fourth voltage to the second n-channel pulldown FET.

5. An output driver, reducing overshoots of voltage at a first power supply voltage and undershoots of voltage at a second power supply voltage, the output driver comprising:
a first circuit for converting a first input signal to a first voltage that exceeds the first power supply voltage;
a second circuit for converting a second input signal to a second voltage that exceeds the first power supply voltage, the second input signal being complementary to the first input signal;
a first n-channel pull up field-effect transistor (FET), having a drain terminal coupled to the first power supply voltage, a source terminal coupled to an output node, and a gate terminal coupled to the first voltage, wherein the first n-channel pull up FET couples the first power supply voltage to the output node when the first n-channel pull up FET is on;
a first n-channel pulldown FET, having a source terminal coupled to a second power supply voltage, a drain terminal coupled to the output node, and a gate terminal coupled to the second voltage, wherein the first n-channel pulldown FET couples the second power supply voltage to the output node when the second n-channel pulldown FET is on;
a second n-channel pull up FET, having a drain terminal coupled to a third voltage between the first and second power supply voltages in magnitude, a source terminal coupled to the output node, and a gate terminal coupled to the first voltage, the second n-channel pull up FET being turned off when a voltage at the output node monotonously increases from the third voltage to first power supply voltage;
a second n-channel pulldown FET, having a source terminal coupled to a fourth voltage between the second power supply voltage and the third voltage in magnitude, a drain terminal coupled to the output node, and a gate terminal coupled to the second voltage, the second n-channel pulldown FET being turned off when a voltage at the output node monotonously decreases from the fourth voltage to the second power supply voltage;

a first n-channel voltage translator PET, having drain and gate terminals each coupled to and receiving the first power supply voltage, and having a source terminal coupled to and providing the third voltage to the second n-channel pull up FET;
a second n-channel voltage translator FET, having a source terminal coupled to and receiving the second power supply voltage, and having drain and gate terminals each coupled to and providing the fourth voltage to the second n-channel pulldown FET; and
whereby a voltage swing at the output node includes a fall range of voltages between the first and second power supply voltages.

6. A method of switching a voltage at an output node between first and second power supply voltages, the method reducing voltage overshoots at the first power supply voltage and voltage undershoots at the second power supply voltage, the method comprising:
converting a first input signal and a second input signal into third and fourth voltage levels that exceed the first power supply level, the first and second input signals being complementary to each other;
providing a first translated voltage from the first power supply voltage using a first voltage translator;
providing a second translated voltage from the second power supply voltage using a second voltage translator;
providing a first pull up current to the output node through a first n-channel pull up transistor in parallel with the first voltage translator and a series-connected second n-channel pull up transistor, in response to the third voltage level, to increase the voltage at the output node at a first increase rate to approximately within the first translated voltage from the first power supply voltage;
providing a second pull up current to the output node through only the first n-channel pull up transistor, in response to the third voltage level, after the voltage at the output node is increased to approximately within the first translated voltage from the first power supply voltage, to further increase the voltage at the output node at a second increase rate to the first power supply voltage in a first steady state, the second increase rate being substantially monotonous and less positive than the first increase rate;
providing a first pulldown current to the output node through a first n-channel pulldown transistor in parallel with the second voltage translator and a series-connected second n-channel pulldown transistor, in response to the fourth voltage level, to decrease the voltage at the output node at a first decrease rate to approximately within the second translated voltage from the second power supply voltage;
providing a second pulldown current to the output node through only the first n-channel pulldown transistor, in response to the fourth voltage level, after the voltage at the output node is decreased to approximately within the second translated voltage from the second power supply voltage, to further decrease the voltage at the output node at a second decrease rate to the second power supply voltage in a second steady state, the second decrease rate being substantially monotonous and less negative than the first decrease rate; and
obtaining a voltage swing at the output node that includes a full range of voltages between the first and second power supply voltages.

7. The method of claim 6, wherein the first voltage translator is a diode-connected FET.

8. The method of claim 7, wherein the diode-connected FET is an n-channel FET.

9. The method of claim 7, wherein the diode-connected FET is a p-channel FET.

10. The method of claim 6, wherein the second voltage translator is a diode-connected FET.

11. The method of claim 10, wherein the diode-connected FET is an n-channel FET.

12. The method of claim 10, wherein the diode-connected FET is a p-channel FET.

13. An output driver reducing overshoots of voltage at a first power supply voltage and undershoots of voltage at a second power supply voltage, comprising:

a first circuit for converting a first input signal to a first voltage that exceeds the first power supply voltage;

a second circuit for converting a second input signal to a second voltage that exceeds the first power supply voltage;

a first pull up field-effect transistor (FET), having a drain terminal coupled to the first power supply voltage, a source terminal coupled to an output node, and a gate terminal coupled to the first voltage, wherein the first pull up FET couples the first power supply voltage to the output node when the first pull up PET is on;

a first pulldown FET, having a source terminal coupled to the second power supply voltage, a drain terminal coupled to the output node, and a gate terminal coupled to the second voltage, wherein the first pulldown FET couples the second power supply voltage to the output node when the first pulldown FET is on;

a second pull up FET, having a drain terminal coupled to a third voltage between the first and second power supply voltages in magnitude, a source terminal coupled to the output node, and a gate terminal coupled to the first voltage, the second pull up FET being turned off when a voltage at the output node monotonously increases from the third voltage to first power supply voltage;

a second pulldown FET, having a source terminal coupled to a fourth voltage between the second power supply voltage and the third voltage in magnitude, a drain terminal coupled to the output node, and a gate terminal coupled to the second voltage, the second pulldown FET being turned off when a voltage at the output node monotonously decreases from the fourth voltage to the second power supply voltage.

14. The output driver of claim 13, wherein the first and second input signals are complementary.

15. The output driver of claim 13, wherein the first pull up FET has the same channel polarity as that of the first pull down transistor.

16. The output driver of claim 13, wherein the second pull up FET has the same channel polarity as that of the second pull down transistor.

17. The output driver of claim 13, wherein all of the FETs have the same channel polarity.

18. A method of switching a voltage at an output node between first and second power supply voltages, the method reducing voltage overshoots at the first power supply voltage and voltage undershoots at the second power supply voltage, the method comprising:

converting a first input signal and a second input signal into third and fourth voltage levels that exceed the first power supply level;

providing a first translated voltage from the first power supply voltage using a first voltage translator;

providing a second translated voltage from the second power supply voltage using a second voltage translator;

providing a first pull up current to the output node through a first pull up transistor in parallel with the first voltage translator and a series-connected second pull up transistor, in response to the third voltage level, to increase the voltage at the output node at a first increase rate to approximately within the first translated voltage from the first power supply voltage;

providing a second pull up current to the output node through only the first pull up transistor, in response to the third voltage level, after the voltage at the output node is increased to approximately within the first translated voltage from the first power supply voltage, to further increase the voltage at the output node at a second increase rate to the first power supply voltage in a first steady state, the second increase rate being substantially monotonous and less positive than the first increase rate;

providing a first pulldown current to the output node through a first pulldown transistor in parallel with the second voltage translator and a series-connected second pulldown transistor, in response to the fourth voltage level, to decrease the voltage at the output node at a first decrease rate to approximately within the second translated voltage from the second power supply voltage;

providing a second pulldown current to the output node through only the first pulldown transistor, in response to the fourth voltage level, after the voltage at the output node is decreased to approximately within the second translated voltage from the second power supply voltage, to further decrease the voltage at the output node at a second decrease rate to the second power supply voltage in a second steady state, the second decrease rate being substantially monotonous and less negative than the first decrease rate; and obtaining a voltage swing at the output node that includes a fall range of voltages between the first and second power supply voltages.

19. The method of claim 18, wherein the first and second input signals are complementary to each other.

20. The output driver of claim 18, wherein the first pull up FET is an n-channel FET.

21. The output driver of claim 18, wherein the second pull up FET is an n-channel FET.

22. The output driver of claim 18, wherein all of the FETs have the same channel polarity.

23. An output driver reducing overshoots of voltage at a first power supply voltage and undershoots of voltage at a second power supply voltage, comprising:

a first circuit for converting a first input signal to a first voltage that exceeds the first power supply voltage;

a second circuit for converting a second input signal to a second voltage that exceeds the first power supply voltage;

a first n-channel field-effect transistor (FET), having a drain terminal coupled to the first power supply voltage, a source terminal coupled to an output node, and a gate terminal coupled to the first voltage, wherein the first FET couples the first power supply voltage to the output node when the first n-channel FET is on;

a second n-channel FET, having a source terminal coupled to the second power supply voltage, a drain terminal coupled to the output node, and a gate terminal coupled to the second voltage, wherein the second FET couples the second power supply voltage to the output node when the second FET is on;

a third n-channel FET, having a drain terminal coupled to a third voltage between the first and second power supply voltages in magnitude, a source terminal coupled to the output node, and a gate terminal coupled to the first voltage, the third FET being turned off when a voltage at the output node monotonously increases from the third voltage to first power supply voltage;

a fourth n-channel FET, having a source terminal coupled to a fourth voltage between the second power supply voltage and the third voltage in magnitude, a drain terminal coupled to the output node, and a gate terminal coupled to the second voltage, the fourth FET being turned off when a voltage at the output node monotonously decreases from the fourth voltage to the second power supply voltage.

24. The output driver of claim 23, wherein the first and second input signals are complementary.

25. The output driver of claim 23, further comprising:

a fifth n-channel FET having drain and gate terminals each coupled to and receiving the first power supply voltage, and having a source terminal coupled to and providing the third voltage to the second n-channel FET; and a sixth n-channel FET having a source terminal coupled to and receiving the second power supply voltage, and having drain and gate terminals each coupled to and providing the fourth voltage to the second n-channel FET.

26. The output driver of claim 23, further comprising:

a first p-channel FET having a source terminal coupled to and receiving the first power supply voltage, and having drain and gate terminals each coupled to and providing the third voltage to the third FET; and a second p-channel FET, having drain and gate terminals each coupled to and receiving the second power supply voltage, and having a source terminal coupled to and providing the fourth voltage to the second n-channel FET.

27. The output driver of claim 23, further comprising:

a first diode, having an anode terminal coupled to and receiving the first power supply voltage, and having a cathode terminal coupled to and providing the third voltage to the second n-channel pullup FET; and a translator diode, having a cathode terminal coupled to and receiving the second power supply voltage, and having an anode terminal coupled to and providing the fourth voltage to the fourth FET.

28. An output driver reducing overshoots of voltage at a first voltage and undershoots of voltage at a second voltage, comprising:

a circuit for converting a pair of input signals to an elevated voltage that exceeds the first voltage;

a first n-channel pull up field-effect transistor (FET), having a drain coupled to the first voltage, a source coupled to an output node, and a gate coupled to the first voltage, wherein the first n-channel pull up FET couples the first voltage to the output node when the first n-channel pull up FET is on;

a first n-channel pulldown FET, having a source coupled to the second voltage, a drain coupled to the output node, and a gate coupled to the second voltage, wherein the first n-channel pulldown FET couples the second voltage to the output node when the first n-channel pulldown FET is on;

a second n-channel pull up FET, having a drain coupled to a third voltage between the first and second voltages in magnitude, a source coupled to the output node, and a gate coupled to the first voltage, the second n-channel pull up FET being turned off when a voltage at the output node monotonously increases from the third voltage to first voltage;

a second n-channel pulldown FET, having a source coupled to a fourth voltage between the second voltage and the third voltage in magnitude, a drain coupled to the output node, and a gate coupled to the second voltage, the second n-channel pulldown FET being turned off when a voltage at the output node monotonously decreases from the fourth voltage to the second voltage.

29. The output driver of claim 28, wherein the first and second input signals are complementary.

30. The output driver of claim 28, further comprising:

a first n-channel voltage translator FET, having a drain and a gate each coupled to and receiving the first voltage, and having a source coupled to and providing the third voltage to the second n-channel pullup FET; and a second n-channel voltage translator FET, having a source coupled to and receiving the fourth voltage, and having a drain and a gate each coupled to and providing the fourth voltage to the second n-channel pulldown FET.

31. The output driver of claim 28, further comprising:

a first p-channel voltage translator FET, having a source coupled to and receiving the first voltage, and having a drain and a gate each coupled to and providing the third voltage to the second n-channel pullup FET; and a second p-channel voltage translator FET, having a drain and a gate each coupled to and receiving the second voltage, and having a source coupled to and providing the fourth voltage to the second n-channel pulldown FET.

32. The output driver of claim 28, further comprising:

a first translator diode, having an anode coupled to and receiving the first voltage and a cathode coupled to and providing the third voltage to the second n-channel pullup FET; and a second translator diode, having a cathode coupled to and receiving the second voltage and an anode coupled to and providing the fourth voltage to the second n-channel pulldown FET.

* * * * *

UNITED STATES PATENT AND TRADEMARK OFFICE
CERTIFICATE OF CORRECTION

PATENT NO. : 6,377,089 B1
DATED : April 23, 2002
INVENTOR(S) : Loughmiller

It is certified that error appears in the above-identified patent and that said Letters Patent is hereby corrected as shown below:

<u>Title page,</u>
Item [56], References Cited, delete "5,929,473 A * 7/1999" and insert
-- 5,959,473 A * 9/1999 --, therefor.

<u>Column 3,</u>
Line 54, delete "(PET)" and insert -- (FET) --, therefor.

<u>Column 6,</u>
Line 59, delete "fall" and insert -- full --, therefor.

<u>Column 8,</u>
Line 1, delete "PET" and insert -- FET --, therefor.

<u>Column 9,</u>
Line 24, delete "PET" and insert -- FET --, therefor.

<u>Column 10,</u>
Line 39, delete "fall" and insert -- full --, therefor.

Signed and Sealed this

Tenth Day of December, 2002

JAMES E. ROGAN
*Director of the United States Patent and Trademark Office*